(12) United States Patent
Mallinson

(10) Patent No.: US 6,943,716 B2
(45) Date of Patent: Sep. 13, 2005

(54) VARIABLE RATE SIGMA DELTA MODULATOR

(75) Inventor: Andrew Martin Mallinson, Kelowna (CA)

(73) Assignee: Ess Technology, Inc., Fremont, CA (US)

(*) Notice: Subject to any disclaimer, the term of this patent is extended or adjusted under 35 U.S.C. 154(b) by 55 days.

(21) Appl. No.: 10/731,885

(22) Filed: Dec. 8, 2003

(65) Prior Publication Data
US 2004/0189501 A1 Sep. 30, 2004

Related U.S. Application Data

(60) Provisional application No. 60/458,918, filed on Mar. 28, 2003.

(51) Int. Cl.[7] .............................................. H03M 1/300
(52) U.S. Cl. ....................................... 341/143; 341/200
(58) Field of Search ................................ 341/143, 200, 341/155, 122, 123

(56) References Cited

U.S. PATENT DOCUMENTS 5,303,346 A * 4/1994 Fesseler et al. ............. 704/230
5,347,310 A * 9/1994 Yamada et al. ......... 375/240.03
5,963,160 A * 10/1999 Wilson et al. ............... 341/143
6,661,362 B2 * 12/2003 Brooks ....................... 341/143
6,664,908 B2 * 12/2003 Sundquist et al. .......... 341/143

* cited by examiner

*Primary Examiner*—Peguy JeanPierre
(74) *Attorney, Agent, or Firm*—Stevens Law Group, P.C.

(57) ABSTRACT

A sigma delta circuit is provided having a sigma delta modulator configured to operate according to a first clock signal and a quantizer connected to the sigma delta modulator, where the quantizer is configured to operate according to a second clock signal. In operation, if a small amplitude signal is received by the sigma delta circuit, the circuit is configured to operate at a fixed output frequency. When a large amplitude signal is received, the circuit is configured to adjust to a different frequency to accommodate the larger signal. The second clock signal may be a variable clock signal, where the quantizer operates according to a variable clock signal in order to adjust to different input signals.

3 Claims, 3 Drawing Sheets

VARIABLE RATE SIGMA DELTA MODULATOR

This application claims priority to U.S. Provisional Patent Application No. Ser. No. 60/458,918 Filing Date: Mar. 28, 2003

BACKGROUND

Sigma delta modulators are well known in the art, and may be implemented in the digital domain. A conventional sigma delta modulator is simply a control loop with a degree of shaping in the frequency domain and a quantizing element in the feedback. The output is the output of the quantizer and hence is one of a small numbers of values, typically two descrete values, and the transfer function, H(s), element operates to shape the noise that the quantizer introduces into the loop. The quantizer is caused to operate at discrete times, where it is clocked by some input signal and creates a discrete set of outputs at defined times.

In one conventional sigma delta design, the output may be used to create an analog signal via a simple switch between two levels, or via a semi-analog finite impulse response filter. Such a design suffers from a problem of mismatched edges in the analog digital to analog converter ("DAC") output. A common manifestation of this problem is the creation of harmonic distortion in the analog signal. Some solutions address fixing the "frequency of edges" to make the frequency invariant with respect to the signal content in the sigma delta stream. Achieving this fixed frequency of edges removes the distortion due to mismatched edge rates in the analog circuit. However, any conventional approach to addressing the frequency of edges does so at the expense of the achievable full scale range of the DAC.

Therefore, there exists a need for an improved sigma delta modulator with reduced distortion. As will be seen, the invention accomplishes this in an elegant manner.

SUMMARY OF THE INVENTION

A sigma delta circuit is provided having a variable rate sigma delta modulator configured to operate according to a first clock signal and a quantizer connected to the variable rate sigma delta modulator, where the quantizer is configured to operate according to a second clock signal. In operation, the sigma delta modulator circuit is configured to operate at a fixed frequency under one set of circumstances, and to operate at a variable frequency under another set of circumstances. If a small amplitude signal is received by the sigma delta circuit, the circuit is configured to operate at a fixed frequency. In contrast, when a large amplitude signal is received, the circuit is configured to adjust to a different frequency to accommodate the larger signal. The second clock signal may be a variable clock signal, where the quantizer operates according to a variable clock signal in order to adjust to different input signals.

DETAILED DESCRIPTION

A system and method are provided for sigma delta modulation that operates at a variable frequency. A sigma delta circuit is provided that has a variable rate sigma delta modulator configured to operate according to a first clock signal and a quantizer connected to the variable rate sigma delta modulator, where the quantizer is configured to operate according to a second clock signal. In operation, the sigma delta modulator circuit is configured to operate at a fixed frequency under one set of circumstances, and to operate at a variable frequency under another set of circumstances. In one embodiment, if a small amplitude signal is received by the sigma delta circuit, the circuit is configured to operate at a fixed frequency. In contrast, when a large amplitude signal is received, the circuit is configured to adjust to a different frequency to accommodate the larger signal. In one embodiment, the second clock signal is a variable clock signal, where the quantizer operates according to a variable clock signal in order to adjust to different input signals.

The description of the invention below is directed to a sigma delta loop configured such that, if an input signal has a small amplitude, will operate as a fixed output "frequency of edges" loop with all the benefits of harmonic suppression. However, if the output signal were desired to be a high amplitude signal, a circuit configured according to the invention will gracefully drop the fixed frequency in order to create a large output. This tradeoff is useful in the design of audio systems that are required to produce a large output and yet to have low distortion. The invention, however, is not limited to this sole embodiment, which is only intended to be illustrative of the invention, the scope of which is defined by the appended claims and all equivalents. A circuit configured according to the invention can achieves a fixed frequency of edges for signals that are a magnitude of amplitude less than a first predetermined level. According to the invention, it transitions cleanly and without distortion to a second mode of operation if the signal is of an amplitude greater than this limit. In one specific example, if the input data is such that one volt RMS is required, this will be achieved by gradually dropping the fixed frequency requirement in favor of an increased range. This change of operating mode is instantaneous, automatic and transparent to the user. It requires no change to the input data to the modulator and creates no artifacts in the output signal.

Figure 1:
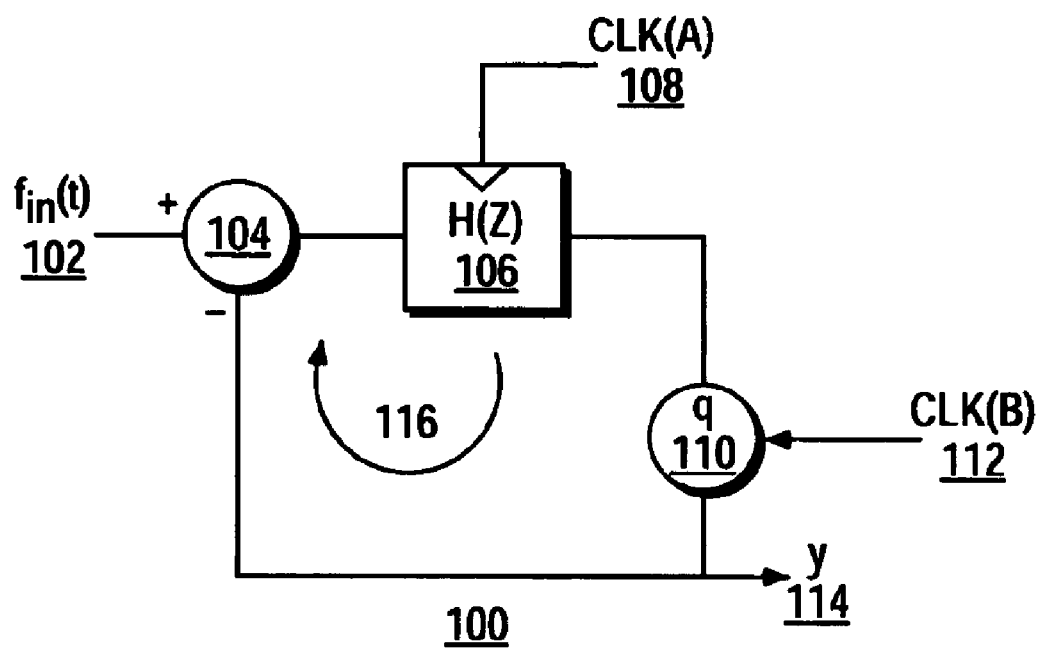
FIG. 1 is a diagrammatic view of a variable rate sigma delta modulation circuit according to the invention.

The invention will be described below in the context of an embodiment of a digital sigma delta loop illustrated in FIG. 1. However, this description is intended as only one example of an embodiment of the invention. The invention is equally applicable to a continuous time filter and indeed to a continuous time sigma delta ADC as well as a DAC. The Circuit 100 of FIG. 1 is configured as a sigma delta loop having an input 102 for receiving an input signal that is defined by a function $f_{in}(t)$. This signal is received by summation unit 104. The output of the summation unit is transmitted to the sigma delta loop filter 106, which operates according to clock signal, CLK(A) 108, received by a clock circuit, not shown, that is connected to the sigma delta modulator. The output from the sigma delta loop filter is received by quantizer, q 110, which operates according to a different clock signal, CLK(B) 112, received by a clock circuit, not shown, connected to the quantizer. The output from the quantizer is connected back to the summation unit, where the signal is inverted, and effectively subtracted from the input signal. The output from the quantizer is also the output, y 114, of the circuit 100. Thus, this is a negative feedback loop 116.

According to the embodiment illustrated in FIG. 1, not only is the quantizer clocked, but also the filter, since the filter will then be a function of the unit delay operator $Z^{-1}$ and not a function of the derivative operator S.

Conventionally, the clock to the quantizer and the clock to the filter are the same, where the whole circuit operates as a finite state machine. The embodiment of the invention illustrated in FIG. 1 depends upon the operation of the filter and the quantizer having separate clocks in a digital implementation. More specifically, it depends upon the time as perceived by the quantizer differing from the time as perceived by the filter Those skilled in the art understand that the operation of non-continuous (hence discreet) time circuits is always relative to a clock. A non-continuous time circuit in effect operates on numbers of clocks. If two non-continuous time circuits share a common clock, the passage of time and hence and operations dependent upon time in these two connected units will operate in a lock-step manner. The appearance of any variable representing time in the descriptive equation of operation of one is at least linearly related to the appearance of any variable representing time in the descriptive equation of operation of the second. This is the common case with a discreet time digital filter and quantizer in a sigma delta loop. Each has, in conventional circuits, a common clock or at least clocks that are linearly related one to the other. For example, it may be that the loop filter is clocked a two times the rate of the quantizer. This is then at least linearly related.

Thus, distinguishing the "time as perceived by the quantizer differing from the time as perceived by the filter" is meant to generalize this distinction: by operating at differing clock rates, not necessarily linearly related, the invention differs from the prior art. Indeed, the invention further generalizes this concept by changing the relation of the clocks of the filter and quantizer with signal amplitude: this is a fundamentally non-linear circuit having a non-linear differential equation that describes its operation.

In another embodiment, if the filter were analog, there would be no discussion necessary, the analog filter time constants are just that, constants. The digital implementation always has a proportionality to the clock. In language of the art, it could be said that a circuit configured according to the invention would "clock the quantizer differently from how it clocks the filter". This would not, however, cover the case where the designer has the filter operating at a faster clock to reduce the amount of logic required. Therefore, this description of the invention must introduce the concept of the time "as designed and used in the filter" and the "time as designed and used in the quantizer" separately.

Figure 2:
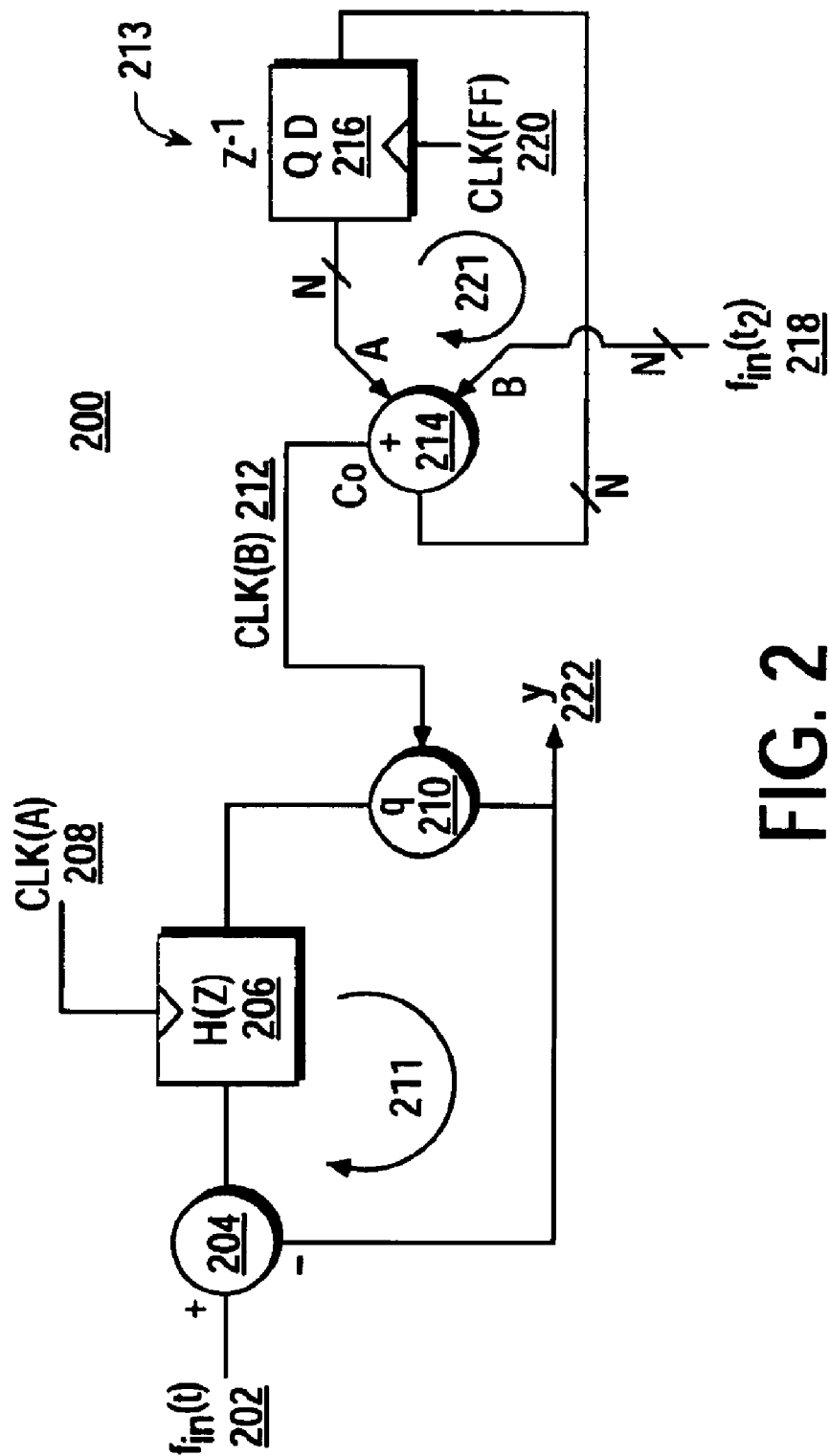
FIG. 2 is a diagrammatic view of a variable rate sigma delta modulation circuit according to the invention.

In another embodiment, the circuit of FIG. 1 is modified in FIG. 2 to stabilize the feedback loop 116 in the presence of the variable clock to the quantizer 210. The circuit 200 includes an input 202 for receiving an input signal that is defined by a function $f_{in}(t)$. A summation unit 204 is configured to receive the input signal. Like the circuit of FIG. 1, the circuit 200 of FIG. 2 includes a sigma delta loop filter 206 that operates according to an individual clock signal, CLK(A) 208, from a clock circuit, not shown. The circuit further includes a quantizer 210 that generates an output signal, y 222, that is fed back to summation unit 204 to complete the loop 211 of circuit 200. According to this embodiment, the quantizer of circuit 200 operates according to a second independent clock signal, CLK(B) 212. To do so, the circuit 200 includes a timing circuit 213 to generate the separate clock signal 212. The clock circuit includes a summation unit 214 configured to receive two inputs, A,B, that are N bits wide, and to output an output signal that is also N bits wide. The summation unit is further configured to output a carry output, $C_0$, when the sum of A and B exceed N bits, giving the carry output. The carry output may be a single bit that is either logic high, or logic low. The N bit output from the summation unit is transmitted to the D input of flip flop 216, that operates according to a clock signal, FF 220. The flip flop is further configured to output a Q output that is transmitted as the A input to the summation unit 214. The B input to the summation unit is received as a signal $f_{in}(t_2)$, received by an input circuit (not shown). The output to the clock circuit 213 is clock signal CLK(B).

Still referring to FIG. 2, the manner in which the clock rate for the quantizer is set, and how it relates to $f_{in}(t)$ $f_{in}(t2)$, the flip flop CLK(FF), will be described. The B input to the summation unit is best described as the clock rate control input—this number is used to set the rate of the clock to the quantizer element (ie the signal 212). The rate of the clock so generated will be Fclk=B/2^N* ClkFF. For example if the element 214 is a digital adder of with N=8, then the setting of the number 128 on the bus B will result in an overflow (and hence a clock on 212) for every other clock of the FF. Thus if the rate of clock pulses to the FF (ClkFF 220) is 1 Mhz then the rate of the clock on 214 to the loop quantizer will be 500 kHz.

In operation, the circuit of FIG. 2 will generally be set to operate with a low clock rate to the loop quantizer. For example, for a small input signal, the bus B may be programmed with only the number 32 on the 8 bit bus. Thus the clock to the quantizer (214) will be operating at $^{32}/_{256}$ or ⅛ of the rate of the FF clock 220. For a small input amplitude the modulator (this sigma delta loop 211) will tend to change on about every edge. This is because, for a small input signal, the sigma delta output is approximately 01010101. Thus, the sigma delta output on Y (222) in this example will be about $^{16}/_{256}$ or 1/16 of the rate of the FF clk 220. One feature of the invention may now be understood: as the input amplitude moves away from zero, the output pattern of a sigma delta loop tends to, for example, 000100010001, this is a frequency of edges that is lower than the 01010101 pattern output when the loop has about zero input. This change in the frequency of edges is a problem. It may, for example, introduce harmonics into a reconstruction analog filter operating on the data stream Y (222). The invention senses this change (decrease) in the frequency of edges and begins to increment the number on the bus B. This causes the frequency provided to the quantizer (214) to increase. Thus, the frequency of edges increases back to where it was for the case of zero input. A circuit embodying the invention operates to adjust the data rate to the quantizer (not necessarily to the descreet time filter element 206) such that the frequency of edges remains constant. Those skilled in the art will note that the elements 214 (adder) and 216 (FF) themselves constitute a first order sigma delta modulator, but would also understand that any circuit capable of controlling the rate of clocks to the quantizer could be used.

The second 221 loop is a modulo arithmetic first order sigma delta modulator. The finite width adder overflows (generates a carry output $C_o$) at a rate that depends upon the value that exists on the bus $f_{in}$. For example, suppose that N=8 and the input quantity fin could then be anywhere from 0 to 255. If set to 0, the adder would never overflow. If set to 128, the adder would overflow every other clock. And, if set to 192, the adder overflows two out of three times. Thus the rate of overflows is controlled by the value on the bus 218. This circuit is a first order sigma delta modulator. That is somewhat less than the clock rate, for example, half the clock rate. In practice, the loop circuit 200 of FIG. 2 operates in a stable condition for a clock to the quantizer of between ½ times and equal to the rate of the clock to the sigma delta modulator. Therefore, fin may be chosen in the range 128–255 to ensure that the adder overflows at least once every two clocks.

Figure 3:
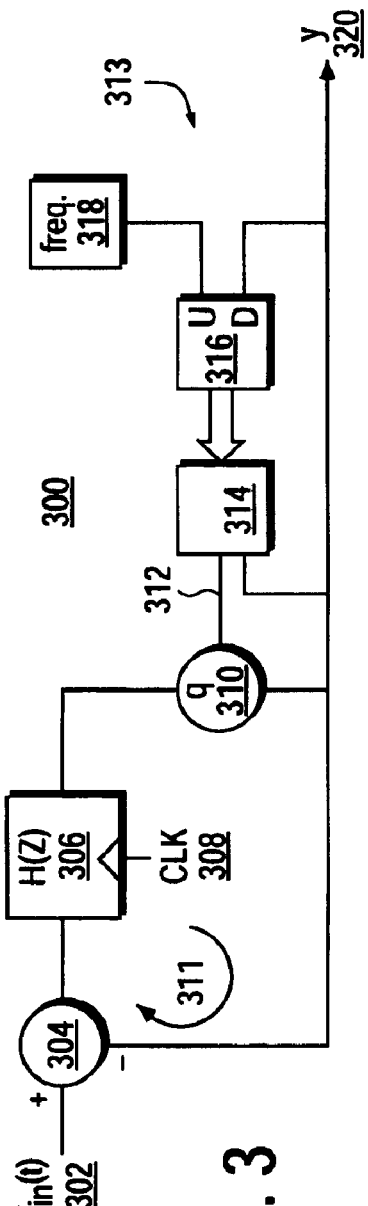
FIG. 3 is a diagrammatic view of a variable rate sigma delta modulation circuit according to the invention.

Another embodiment of the invention is illustrated in FIG. 3. Circuit 300 has an input 302 configured to receive an input signal $f_{in}(t)$. A summation unit 304 is configured to receive the input signal. Like the circuit of FIG. 1, the circuit 300 of FIG. 3 includes a sigma delta modulator loop filter 306 that operates according to an individual clock signal, CLK 308, from a clock circuit, not shown. The circuit further includes a quantizer 310 that generates an output signal, y 320, which is fed back to summation unit 304 to complete the loop 311 of circuit 300. According to this embodiment, the quantizer of circuit 300 operates according to a second independent clock signal, CLK 312. To do so, the circuit 300 includes a timing circuit 313 to generate the separate clock signal 312. The timing circuit 313 is configured to generate a clock signal from a second sigma delta modulator 314 that feeds into the quantizer 310. The second sigma delta modulator receives a signal from an up/down circuit 316. The counter is configured to receive a input frequency signal 318 at the up input, U, of the counter. The counter is further configured to receive the output signal, y 320, at the down, D, input of the counter.

Figure 4:
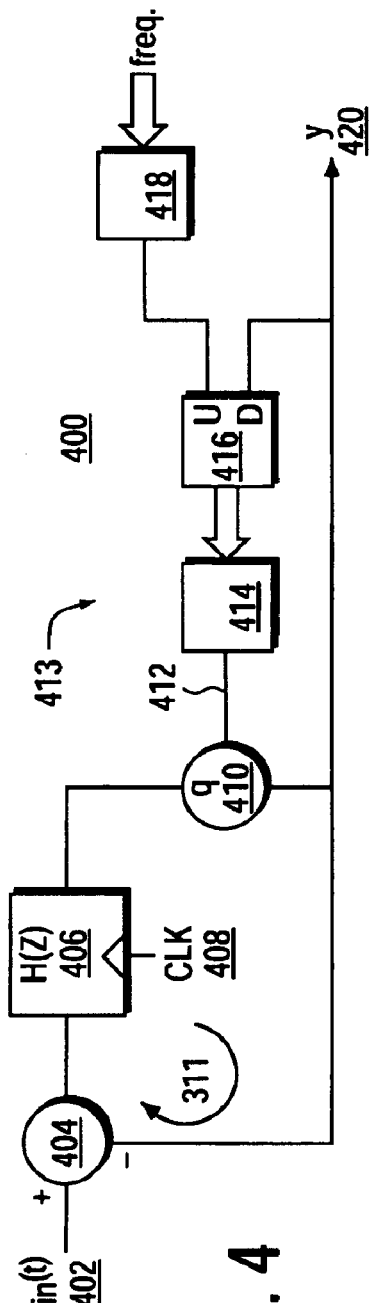
FIG. 4 is a flow chart illustrating one embodiment of a method according to the invention.

The counter 316 is arranged to count down when two successive states of the quantizer output differ. That is, whenever the quantizer makes a transition between states, a down count event is registered in the up/down counter. The counter output is connected as the $f_{in}$, the input frequency to the sigma delta modulator that controls the clock of the quantizer of the sigma delta modulator loop 311. Thus the rate of the clock has been reduced by a small amount as a result of this transition on the quantizer output. Suppose further that a reference frequency were applied to the "up" input to the counter such that a specific rate of "up" events is occurring. Now, the only stable condition is that the rate of transitions on the quantizer output equal the rate of transitions on the frequency input. Thus, if a) the feedback is negative, b) the feedback is stable (and hence does not oscillate), and c) the required rate of the quantizer output transitions can be achieved by a clock rate to the quantizer between ½ and 1 times the rate of the filter, then, if all these three criteria hold, the output must have an average frequency equal to the frequency input rate from the element 318 and hence any reconstructed analog output using the stream of data at y (320) cannot have a distortion due to mismatched edge rates. In practice, all the above criteria can be met for any input signal to the modulator where the instantaneous value below some level about −10 db relative to FS (Full Scale), i.e. the signal is about ⅓ (=10^−10/20) of the way from 0 to FS. Conveniently, the frequency input may be derived from a third Sigma Delta modulator, as illustrated in FIG. 4. Circuit 400 has an input 402 configured to receive an input signal $f_{in}(t)$. A summation unit 404 is configured to receive the input signal. Like the circuit of FIG. 1, the circuit 400 of FIG. 4 includes a sigma delta modulator loop filter 406 that operates according to an individual clock signal, CLK 408, from a clock circuit, not shown. The circuit further includes a quantizer 410 that generates an output signal, y 420, that is fed back to summation unit 404 to complete the loop 411 of circuit 400. According to this embodiment, the quantizer of circuit 400 operates according to a second independent clock signal, CLK 412. To do so, the circuit 400 includes a timing circuit 413 to generate the separate clock signal 412. The timing circuit 413 is configured to generate a clock signal from a second sigma delta modulator 414 that feeds into the quantizer 410. The second sigma delta modulator receives a signal from an up/down circuit 416. The counter is configured to receive a input frequency signal from a third sigma delta generator 418 at the up input, U, of the counter. Like the circuit of FIG. 3, the counter is further configured to receive the output signal, y 420, at the down, D, input of the counter. In this configuration, the input U may be held constant or indeed varied as illustrated. It may be observed that the average output transition rate equals the frequency input rate. This implies a period of time over which this is true—i.e. a bandwidth of operation of this control loop. This bandwidth relates to the width of the up/down counter and can be set for stable operation at well above the audio range. Also, what happens if the condition that the required rate of the quantizer output transitions can be achieved by a clock rate to the quantizer between ½ and 1 times the rate of the filter is not met? Once designed the feedback is always negative and can be arranged to be stable, this meeting the first two of the three criteria mentioned above, but the final requirement that the output transition rate can be controlled by a clock to quantizer always between ½ and 1 times the loop filter clock cannot be guaranteed since this depends upon the input amplitude to the modulator.

It is the response to the nonlinear behavior of the loop when the condition that the required rate of the quantizer output transitions can be achieved by a clock rate to the quantizer between ½ and 1 times the rate of the filter is not met that makes a circuit configured according to the invention useful. No discontinuous operation of the primary loop is possible as the second frequency control loop fails, because the quantizer output is always in the feedback loop of the primary sigma delta modulator. This means that the so configured circuit need only limit the output of the secondary loop. In the illustrated example, it need only clamp the values of the counter driving the second sigma delta modulator to 128 and 255.

The above description of the invention is directed to a sigma delta loop configured such that, if an input signal has a small amplitude, it will operate as a fixed output "frequency of edges" loop with all the benefits of harmonic suppression. However, if the output signal were desired to be a high amplitude signal, a circuit configured according to the invention will gracefully drop the fixed frequency in order to create a large output. This tradeoff is useful in the design of audio systems that are required to produce a large output and yet to have low distortion. The invention, however, is not limited to this sole embodiment, which is only intended to be illustrative of the invention, the scope of which is defined by the appended claims and all equivalent

What is claimed is:

1. A sigma delta circuit comprising:
   a sigma delta modulator configured to operate according to a first clock signal; and
   a quantizer connected to the sigma delta modulator and configured to operate according to a second clock signal, wherein the sigma delta modulator is further configured to operate at a fixed output frequency of transitions under one set of circumstances, and to operate at a variable frequency under another set of circumstances.

2. A sigma delta circuit according to claim 1, wherein the second clock signal that determines the output frequency of transitions is a variable clock signal.

3. A sigma delta circuit comprising:
   a sigma delta modulator configured to operate according to a first clock signal; and a quantizer connected to the sigma delta modulator and configured to operate according to a second clock signal, wherein the sigma delta quantizer element is configured to operate at a variable clock frequency such that for small input signals a fixed frequency of output transitions is produced and for large input signals a possibly variable output frequency of edges is produced.

* * * * *